United States Patent [19]

Stockmaster

[11] 4,429,937

[45] Feb. 7, 1984

[54] CIRCUIT BOARD MODULE MOUNTING UNIT

[75] Inventor: Edward F. Stockmaster, Mentor, Ohio

[73] Assignee: The Babcock & Wilcox Company, New Orleans, La.

[21] Appl. No.: 286,106

[22] Filed: Jul. 22, 1981

[51] Int. Cl.³ .............................................. H05K 7/14
[52] U.S. Cl. ................................... 339/65; 339/17 M; 361/415
[58] Field of Search ................ 339/17 LM, 17 M, 65, 339/66, 75 MP, 91 R; 361/415, 416, 417, 419, 420

[56] References Cited

U.S. PATENT DOCUMENTS

| | | | |
|---|---|---|---|
| 3,736,472 | 5/1973 | Muldoon | 361/415 |
| 3,810,433 | 5/1974 | Posner | 361/415 |
| 3,950,060 | 4/1976 | Stipanuk | 339/91 R |

FOREIGN PATENT DOCUMENTS 2714563 10/1978 Fed. Rep. of Germany ...... 361/415

529570 3/1977 U.S.S.R. ...................... 339/176 MP

*Primary Examiner*—Eugene F. Desmond
*Assistant Examiner*—David Pirlot
*Attorney, Agent, or Firm*—Vytas R. Matas; Robert J. Edwards

[57] ABSTRACT

A module mounting unit formed from a pair of side plates and a series of U-shaped cross-members mounted between the side plates for slidably retaining a series of printed circuit board modules by sliding the modules in guideways provided in the module mounting unit. The modules each have a resilient tab having a prong with a tapered head. The module mounting unit has a series of front apertures formed to allow the head of each module to engage the aperture at full insertion of the module, thus precluding withdrawal of the module from the rack. The cross-members each have a series of spaced apertures along one leg of the U for engaging the tabs of the modules and a series of alternately-spaced circular and oval apertures to facilitate the mounting of the module guideways to the module mounting unit.

10 Claims, 3 Drawing Figures

CIRCUIT BOARD MODULE MOUNTING UNIT

TECHNICAL FIELD

The present invention relates to mounting devices generally and in particular to a circuit board module mounting unit for retaining a series of circuit board modules therein.

BACKGROUND ART

Complex and large electric circuit networks such as systems control networks for power stations and nuclear reactors are typically broken down into a plurality of small circuits each mounted on a modular printed circuit board. The printed circuit boards, which are electrically interconnected to make up the network, enable fast and easy replacement of failed network components as well as providing flexibility of design.

Printed circuit boards are typically rectangular and are mounted vertically in racks. Generally, the top and bottom edges of the boards slide in tracks and the back edge is equipped with some electrical connector means.

The front of the printed circuit board module is equipped with a plate for handling, identification and esthetic purposes. Also some mechanism is typically provided to lock the circuit board module to the circuit board rack. This is desired to prevent withdrawal of the module and thereby breaking of the circuit network in the event of some withdrawal force being applied to the circuit board by accident.

Known racks for retaining such printed circuit board modules were usually trays made from a series of various custom parts, were not reversible and were expensive to manufacture.

SUMMARY OF THE INVENTION

The present invention overcomes the disadvantages of the prior art devices as well as others by providing a module mounting unit for mounting a series of circuit board control modules which is assembled from two different pieces, making it easy to manufacture and assemble as well as inexpensive and is, furthermore, reversible so that the entire unit may be mounted on either side.

The module mounting unit is made from a pair of identical side plates which side plates are separated by a series of identical brackets, each of which provide a series of mounting apertures for retaining the control modules within the module mounting unit as well as providing a series of guideway mounting apertures for easily mounting a series of circuit board guideways across the series of brackets to provide guideways or slides for sliding the circuit boards of the circuit board control modules therein.

Each bracket is formed as a U-shaped channel and one leg of the U-shaped channel has a series of spaced circular apertures while the bottom or well of the U-shaped channel has a series of spaced alternating circular and oval apertures. The front and back mounting of the U-shaped channels between the pair of side plates is done so as to have the series of circular apertures along the leg of the U-shaped bracket facing out to accept a tab on the face of the circuit board control module to thus lock the circuit board control module into the module mounting unit.

The well or bottom of the U-shaped bracket has a series of alternately-spaced circular and oval apertures used for mounting guideways for sliding the circuit board of the circuit board control module therein. One end of the well starts with a circular hole and ends with an oval hole. The rotating of the middle bracket 180° allows a circular hole to be in line with adjacent oval holes of the adjoining brackets. The guideways are strips having three push-in tabs which now may be pushed into the middle bracket's circular hole and the oval holes of the adjoining bracket to allow any tolerance variations on the tab locations on the guideways to be compensated for by movement within the oval apertures of the adjacent brackets.

In view of the foregoing, it will be seen that one object of the present invention is to provide a module mounting unit which is simple and inexpensive to construct.

Another object of the present invention is to provide a variation in the uses of the individual identical parts of the module mounting unit by a simple alignment and rotation of the individual parts.

These and other objects of the present invention will be more readily understood from a consideration of the following description of the preferred embodiment when considered with the accompanying drawings.

DESCRIPTION OF THE PREFERRED EMBODIMENT

Figure 1:
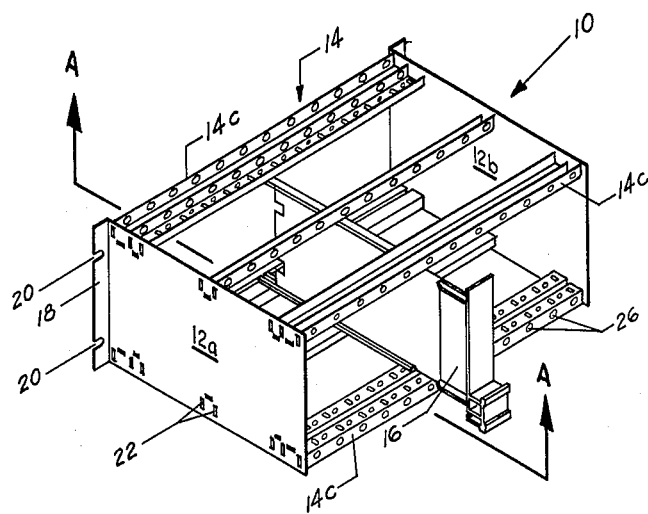
FIG. 1 is a perspective view of the module mounting unit of the present invention showing a circuit board module mounting unit partially located therein.
Figure 3:
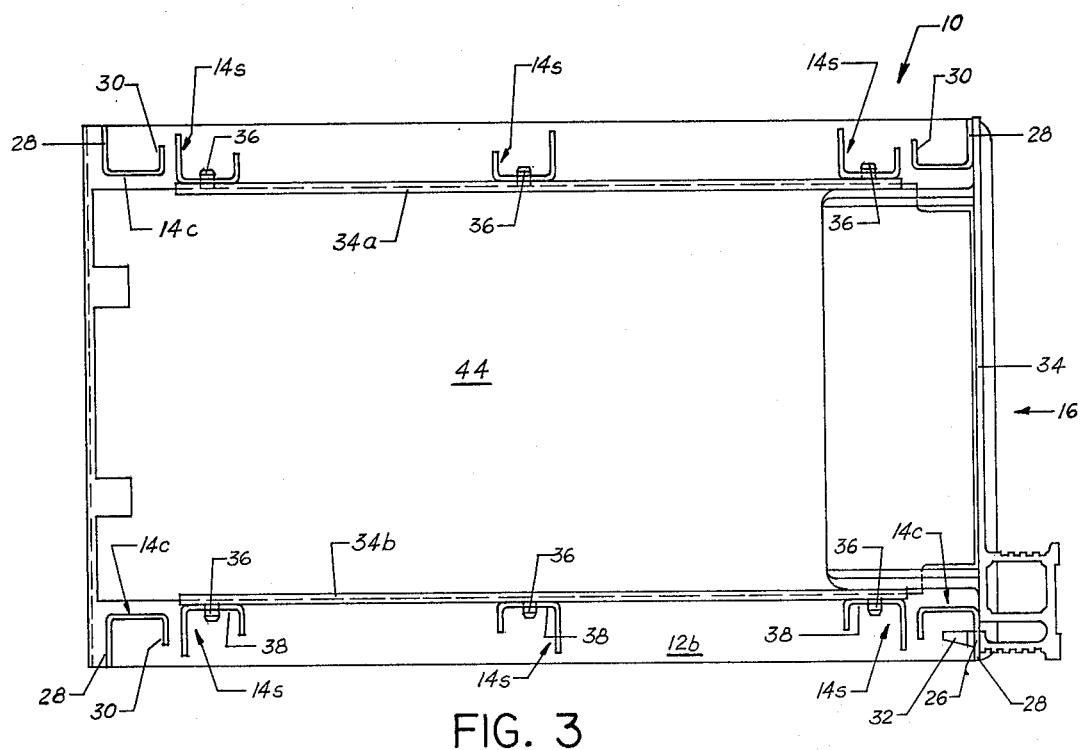
FIG. 3 is a cross-sectional side view of the FIG. 1 modular mounting unit taken along section A-A, showing the circuit board control module fully inserted into the module mounting unit.

Referring now to the drawings wherein the showings are intended to detail a preferred embodiment of the present invention and are not intended to limit the invention thereto, a module mounting unit 10 is shown in FIGS. 1 and 3 which is constructed from a pair of identical side plates 12a, 12b, and a series of identical U-shaped cross-members 14. The module mounting unit 10 is intended to mount twelve circuit board control modules 16 in a side-by-side arrangement. For the sake of simplicity, only one module 16 is shown but it will be understood that the mounting of an additional eleven modules 16 would be accomplished in a similar manner as will be described with reference to the single module 16 shown.

The module mounting unit 10 is intended for mounting is known system cabinetry. Such system cabinets are front and rear access units to allow simplified installation and servicing. Standard blower assemblies are mounted inside the cabinet for cabinet cooling.

Turning now to FIG. 1, it will be seen that the side plates 12a and 12b are identical with the side plate 12b being a 180° rotation of the side plate 12a. Although only the side plate 12a will be discussed, it will be understood that all the elements found in side plate 12a also appear in side plate 12b. With this in mind, side plate 12a has a flange 18 with a pair of slots 20 used to mount the module mounting unit 10 within the system cabinet by way of large head screws. The face of the side plate 12a has a series of elongated slots 22 into which tabs 24 of the individual U-shaped cross-members fit. The tabs 24, after being fitted into the elongated slots 22, are welded therein to form the module mounting unit 10.

Each U-shaped cross-member 14 has twelve spaced apertures or holes 26 along the longer leg portion 28 of the U-shaped cross-member 14. The shorter leg portion 30 of each cross-member 14 is solid to provide strength and rigidity. Four of the U-shaped cross-members 14 are mounted at the corners of the side plates 12a and 12b to act as corner cross-members 14c. The corner cross-members 14c are mounted to have the long leg portions 28 facing out from the module mounting unit. The apertures 26 are used to press a tab 32 extending from the face 34 of each circuit board control module therein to thus retain the circuit board control module 6 inside of the module mounting unit 10. The twelve holes 26 on each long leg portion 28 of cross-member 14 are spaced to allow twelve circuit board control modules 16 to be thus attached into the module mounting unit 10. The corner cross-members 14c located at the rear of the module mounting unit 10 also have the long leg portion 28 extending out from the module mounting unit to allow a known cable connection termination unit to be mounted to the holes 26 or others provide there in a well known manner to thus provide input and output signals from the twelve circuit board control modules 16.

Circuit board guideways 34a, 34b are mounted across three support U-shaped cross-members 14s spacedly mounted between the side plates 12a and 12b to allow push-in tabs 36 extending from the bottom of each guideway 34 to be pressed into apertures located along the bottom portion 38 of each U-shaped cross-member 14.

Figure 2:
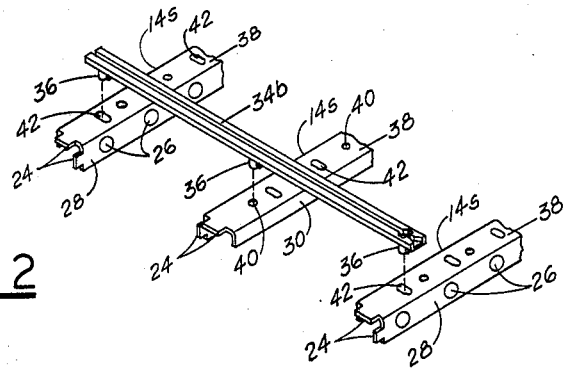
FIG. 2 is an expanded view of the guideway mounting brackets of the FIG. 1 modular mounting unit.

With particular reference to FIG. 2, each U-shaped cross-member 14 is seen to have a series of alternating circular apertures 40 and oval apertures 42. Each cross-member 14 has an oval aperture 42 as the first aperture at one end and a circular aperture 40 as the last aperture at the other end. Thus, the rotation of the middle support cross-member 14s 180° allows the first aperture 40 to be circular on the middle support member 14s and to have oval apertures 42 as the first apertures on the two support members 14s adjoining it. The guideway 34b is mounted across the three support members 14s by pressing the middle tab 36 into the circular aperture 40 and the end tabs 36 into the adjoining oval apertures 42. The oval apertures 42 allow any tolerance variations to be picked up by the extended length of the oval apertures 42. It will be understood that, in this manner, twelve bottom guideways 34 may be pressed into the modular mounting unit as well as twelve top guideways 34 directly above the bottom-mounted guideways 34. The circuit board portion 44 of each circuit board control module 16 is thus easily slid into the modular mounting unit 10 to have the card portion 44 located between the guideways 34a and 34b.

Certain modifications and improvements will occur to those skilled in the art upon the reading of this Specification. It will be understood that all such modifications and improvements have been deleted herein for the sake of conciseness and readability but are considered to be within the scope of the following claims.

I claim:

1. A module mounting unit for mounting a series of circuit board control modules comprising:
   a pair of side plates;
   a first bracket mounted between the lower front corners of said pair of side plates to have a series of apertures along the face of said bracket;
   a second bracket mounted between the upper front corners of said pair of side plates;
   a series of support brackets spacedly-mounted along the lengths of said pair of side plates to separate said plates and having a series of circular and oval holes along the same face of the support bracket; and
   a series of channel strips parallel-mounted across the circular and oval holes of said series of support brackets to form guideways for the circuit boards of said circuit board control modules.

2. A module mounting unit as set forth in claim 1 wherein each of said circuit board control modules includes a printed circuit board connected to a front panel having a tab member extending therefrom and wherein the printed circuit board is slideable in said channel strips to locate said control module in the module mounting unit and the tab member is pressable into one of said series of holes along the face of said first bracket to retain said control module in the module mounting unit.

3. A module mounting unit as set forth in claim 2 including:
   a pair of rear mounting brackets located at the rear top and bottom portions of said side plates to extend between said side plates with a series of apertures extending along the face of said pair of rear mounting brackets for mounting a control module signal connection panel thereto.

4. A module mounting unit as set forth in claim 1 wherein said series of support brackets includes three top-mounted and three bottom-mounted support brackets equally spaced along the length of said pair of side plates with each bracket having alternately-spaced circular and oval holes.

5. A module mounting unit as set forth in claim 4 wherein the circular hole on the middle bracket of said three top-mounted and three bottom-mounted brackets is aligned with the oval holes of the adjoining brackets and wherein each of said series of channel strips has three mounting tabs connectable to the circular hole and the adjoining oval holes of said series of support brackets.

6. A module mounting unit as set forth in claim 1 wherein said second bracket is identical to said first bracket to make the module mounting unit 180° reversible.

7. A module mounting unit as set forth in claim 1 wherein each of said support brackets and said first and second brackets is formed as a U-shaped channel having a series of equally-spaced circular holes along one leg thereof and equally-spaced alternating circular and oval holes along the channel portion thereof beginning with a circular hole at one end of the channel portion and ending with an oval hole at the other end thereof.

8. A module mounting unit as set forth in claim 7 wherein alternate support brackets of said series of support brackets is 180° rotated to align an oval hole on one support bracket with a circular hole on the adjoining support bracket.

9. A module mounting unit as set forth in claim 8 wherein each bracket has a pair of tab members at opposite ends thereof and each of said pair of side plates has a series of elongated slots therein for fitting said tab members to thus align the brackets.

10. A module mounting unit as set forth in claim 9 wherein the tab members are welded to said pair of side plates.

* * * * *